United States Patent
Bilodeau et al.

(10) Patent No.: US 10,340,150 B2
(45) Date of Patent: Jul. 2, 2019

(54) NI:NIGE:GE SELECTIVE ETCH FORMULATIONS AND METHOD OF USING SAME

(71) Applicants: Entegris, Inc., Billerica, MA (US); ATMI TAIWAN CO., LTD., Hsin-chu (TW)

(72) Inventors: Steven Bilodeau, Oxford, CT (US); Jeffrey A. Barnes, Danielsville, PA (US); Emanuel Cooper, Scarsdale, NY (US); Hsing-Chen Wu, Hsin-chu (TW); Sheng-Hung Tu, Hsin-chu (TW); Thomas Parson, Waterbury, CT (US); Min-chieh Yang, Hsin-chu (TW)

(73) Assignee: Entegris, Inc., Billerica, MA (US)

(*) Notice: Subject to any disclaimer, the term of this patent is extended or adjusted under 35 U.S.C. 154(b) by 0 days.

(21) Appl. No.: 15/103,593

(22) PCT Filed: Dec. 16, 2014

(86) PCT No.: PCT/US2014/070566
§ 371 (c)(1),
(2) Date: Jun. 10, 2016

(87) PCT Pub. No.: WO2015/095175
PCT Pub. Date: Jun. 25, 2015

(65) Prior Publication Data
US 2016/0314990 A1  Oct. 27, 2016

Related U.S. Application Data

(60) Provisional application No. 61/916,543, filed on Dec. 16, 2013.

(51) Int. Cl.
| | |
|---|---|
| H01L 21/3213 | (2006.01) |
| C09K 13/00 | (2006.01) |
| H01L 21/3205 | (2006.01) |
| H01L 29/16 | (2006.01) |
| H01L 29/26 | (2006.01) |
| H01L 29/45 | (2006.01) |
| C09G 1/04 | (2006.01) |
| H01L 21/24 | (2006.01) |

(52) U.S. Cl.
CPC ........ H01L 21/32134 (2013.01); C09K 13/00 (2013.01); H01L 21/32051 (2013.01); H01L 29/16 (2013.01); H01L 29/26 (2013.01); H01L 29/45 (2013.01); C09G 1/04 (2013.01); H01L 21/24 (2013.01); H01L 21/246 (2013.01)

(58) Field of Classification Search
CPC . C23F 1/14; C23F 1/26; H01L 21/246; H01L 21/32051; H01L 21/32134; H01L 29/16; H01L 29/26; H01L 29/45; H01L 21/24; C09G 1/00; C09G 1/04; C09K 13/00

USPC .... 252/79.1, 79.2, 79.3, 79.4; 438/745, 750, 438/754; 134/1.1, 1.2, 1.3
See application file for complete search history.

(56) References Cited

U.S. PATENT DOCUMENTS

| | | |
|---|---|---|
| 5,320,709 A | 6/1994 | Bowden |
| 5,702,075 A | 12/1997 | Lehrman |
| 5,976,928 A | 11/1999 | Kirlin et al. |
| 5,993,685 A | 11/1999 | Currie et al. |
| 6,194,366 B1 | 2/2001 | Naghshineh et al. |
| 6,211,126 B1 | 4/2001 | Wojtczak et al. |
| 6,224,785 B1 | 5/2001 | Wojtczak et al. |
| 6,280,651 B1 | 8/2001 | Wojtczak et al. |
| 6,306,807 B1 | 10/2001 | Wojtczak et al. |
| 6,322,600 B1 | 11/2001 | Brewer et al. |
| 6,323,168 B1 | 11/2001 | Kloffenstein et al. |
| 6,344,432 B1 | 2/2002 | Wojtczak et al. |
| 6,346,741 B1 | 2/2002 | Van Buskirk et al. |
| 6,395,194 B1 | 5/2002 | Russell et al. |
| 6,409,781 B1 | 6/2002 | Wojtczak et al. |
| 6,492,308 B1 | 12/2002 | Naghshineh et al. |
| 6,527,819 B2 | 3/2003 | Wojtczak et al. |
| 6,566,315 B2 | 5/2003 | Wojtczak et al. |
| 6,627,587 B2 | 9/2003 | Naghshineh et al. |
| 6,698,619 B2 | 3/2004 | Wertenberger |
| 6,723,691 B2 | 4/2004 | Naghshineh et al. |
| 6,735,978 B1 | 5/2004 | Tom et al. |
| 6,755,989 B2 | 6/2004 | Wojtczak et al. |
| 6,773,873 B2 | 8/2004 | Seijo et al. |
| 6,800,218 B2 | 10/2004 | Ma et al. |
| 6,802,983 B2 | 10/2004 | Mullee et al. |
| 6,830,627 B1 | 12/2004 | Covert et al. |
| 6,849,200 B2 | 2/2005 | Baum et al. |
| 6,875,733 B1 | 4/2005 | Wojtczak |
| 6,896,826 B2 | 5/2005 | Wojtczak et al. |
| 6,943,139 B2 | 9/2005 | Korzenski et al. |
| 6,989,358 B2 | 1/2006 | Korzenski et al. |
| 7,011,716 B2 | 3/2006 | Xu et al. |
| 7,029,373 B2 | 4/2006 | Ma et al. |
| 7,030,168 B2 | 4/2006 | Xu et al. |
| 7,119,052 B2 | 10/2006 | Korzenski et al. |

(Continued)

FOREIGN PATENT DOCUMENTS

| | | |
|---|---|---|
| EP | 1575082 A2 | 9/2005 |
| JP | 2011159658 A | 8/2011 |

(Continued)

OTHER PUBLICATIONS

International Search Report, dated Apr. 29, 2015.

(Continued)

Primary Examiner — Lan Vinh
(74) Attorney, Agent, or Firm — Entegris, Inc.

(57) ABSTRACT

Compositions and methods for selectively removing unreacted metal material (e.g., unreacted nickel) relative to metal germanide (e.g., NiGe), metal-III-V materials, and germanium from microelectronic devices having same thereon. The compositions are substantially compatible with other materials present on the microelectronic device such as low-k dielectrics and silicon nitride.

12 Claims, No Drawings

(56) References Cited

U.S. PATENT DOCUMENTS

| Patent/Pub No. | Date | Inventor |
|---|---|---|
| 7,119,418 B2 | 10/2006 | Xu et al. |
| 7,160,815 B2 | 1/2007 | Korzenski et al. |
| 7,188,644 B2 | 3/2007 | Kelly et al. |
| 7,223,352 B2 | 5/2007 | Korzenski et al. |
| 7,300,601 B2 | 11/2007 | Liu et al. |
| 7,326,673 B2 | 2/2008 | Xu et al. |
| 7,335,239 B2 | 2/2008 | Baum |
| 7,361,603 B2 | 4/2008 | Liu et al. |
| 7,365,045 B2 | 4/2008 | Walker et al. |
| 7,485,611 B2 | 2/2009 | Roeder et al. |
| 7,534,752 B2 | 5/2009 | Wojtczak et al. |
| 7,553,803 B2 | 6/2009 | Korzenski et al. |
| 7,557,073 B2 | 7/2009 | Korzenski et al. |
| 7,736,405 B2 | 6/2010 | Darsillo et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 8,026,200 B2 | 9/2011 | Cooper et al. |
| 8,058,219 B2 | 11/2011 | Rath et al. |
| 8,114,220 B2 | 2/2012 | Visintin et al. |
| 8,178,585 B2 | 5/2012 | Petruska et al. |
| 8,236,485 B2 | 8/2012 | Minsek et al. |
| 8,304,344 B2 | 11/2012 | Boggs et al. |
| 8,338,087 B2 | 12/2012 | Rath et al. |
| 8,367,555 B2 | 2/2013 | Afzali-Ardakani et al. |
| 8,436,537 B2 * | 5/2013 | Kim ............... H01J 9/02 313/587 |
| 8,618,036 B2 | 12/2013 | Afzali-Ardakani et al. |
| 8,685,909 B2 | 4/2014 | Angst et al. |
| 8,754,021 B2 | 6/2014 | Barnes et al. |
| 8,778,210 B2 | 7/2014 | Cooper et al. |
| 8,951,948 B2 | 2/2015 | Rath et al. |
| 9,045,717 B2 | 6/2015 | Nakanishi et al. |
| 9,063,431 B2 | 6/2015 | Barnes et al. |
| 9,074,169 B2 | 7/2015 | Chen et al. |
| 9,074,170 B2 | 7/2015 | Barnes et al. |
| 9,175,404 B2 | 11/2015 | Kojima et al. |
| 9,215,813 B2 | 12/2015 | Brosseau et al. |
| 9,221,114 B2 | 12/2015 | Chen et al. |
| 9,238,850 B2 | 1/2016 | Korzenski et al. |
| 2004/0178476 A1 | 9/2004 | Brask et al. |
| 2005/0118832 A1 | 6/2005 | Korzenski et al. |
| 2005/0145311 A1 | 7/2005 | Walker et al. |
| 2005/0192193 A1 | 9/2005 | Korzenski et al. |
| 2005/0196962 A1 | 9/2005 | Demeurisse et al. |
| 2005/0227482 A1 | 10/2005 | Korzenski et al. |
| 2005/0263490 A1 | 12/2005 | Liu et al. |
| 2006/0019850 A1 | 1/2006 | Korzenski et al. |
| 2006/0063687 A1 | 3/2006 | Minsek et al. |
| 2006/0148666 A1 | 7/2006 | Peters et al. |
| 2006/0154186 A1 | 7/2006 | Minsek et al. |
| 2006/0249482 A1 | 11/2006 | Wrschka et al. |
| 2007/0032025 A1 | 2/2007 | Brunco et al. |
| 2007/0251551 A1 | 11/2007 | Korzenski et al. |
| 2007/0257010 A1 | 11/2007 | Bernards et al. |
| 2008/0076688 A1 | 3/2008 | Barnes et al. |
| 2008/0125342 A1 | 5/2008 | Visintin et al. |
| 2008/0271991 A1 | 11/2008 | Korzenski et al. |
| 2009/0032766 A1 | 2/2009 | Rajaratnam et al. |
| 2009/0192065 A1 | 7/2009 | Korzenski et al. |
| 2009/0212021 A1 | 8/2009 | Bernhard et al. |
| 2009/0215269 A1 | 8/2009 | Boggs et al. |
| 2009/0253072 A1 | 10/2009 | Petruska et al. |
| 2009/0301996 A1 | 12/2009 | Visintin et al. |
| 2010/0006799 A1 * | 1/2010 | Bernards ............ C23F 1/02 252/79.2 |
| 2010/0056410 A1 | 3/2010 | Visintin et al. |
| 2010/0065530 A1 | 3/2010 | Walker et al. |
| 2010/0087065 A1 | 4/2010 | Boggs et al. |
| 2010/0112728 A1 * | 5/2010 | Korzenski ......... H01L 21/02079 438/3 |
| 2010/0163788 A1 * | 7/2010 | Visintin ............ C11D 1/62 252/79.3 |
| 2010/0261632 A1 * | 10/2010 | Korzenski ............ C11D 7/265 510/175 |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2011/0275164 A1 | 11/2011 | Visitin et al. |
| 2012/0202305 A1 * | 8/2012 | Cho ................ C09K 13/00 438/34 |
| 2012/0231632 A1 | 9/2012 | Takahashi et al. |
| 2013/0122701 A1 * | 5/2013 | Krupa ............... H01L 21/02 438/663 |
| 2013/0270217 A1 | 10/2013 | Yoshida et al. |
| 2013/0280123 A1 | 10/2013 | Chen et al. |
| 2013/0295712 A1 | 11/2013 | Chen et al. |
| 2013/0296214 A1 * | 11/2013 | Barnes ............ H01L 21/02063 510/176 |
| 2013/0303420 A1 | 11/2013 | Cooper et al. |
| 2014/0038420 A1 | 2/2014 | Chen et al. |
| 2014/0264607 A1 * | 9/2014 | Basu ............... H01L 29/785 257/365 |
| 2014/0306162 A1 | 10/2014 | Poe et al. |
| 2014/0318584 A1 | 10/2014 | Cooper et al. |
| 2014/0319423 A1 | 10/2014 | Cooper |
| 2015/0027978 A1 | 1/2015 | Barnes et al. |
| 2015/0045277 A1 | 2/2015 | Liu et al. |
| 2015/0050199 A1 | 2/2015 | Korzenski et al. |
| 2015/0075570 A1 | 3/2015 | Wu et al. |
| 2015/0114429 A1 | 4/2015 | Jenq et al. |
| 2015/0162213 A1 | 6/2015 | Chen et al. |
| 2015/0168843 A1 | 6/2015 | Cooper et al. |
| 2015/0344825 A1 | 12/2015 | Cooper et al. |
| 2016/0020087 A1 | 1/2016 | Liu et al. |
| 2016/0032186 A1 | 2/2016 | Chen et al. |
| 2016/0075971 A1 | 3/2016 | Liu et al. |
| 2016/0122696 A1 | 5/2016 | Liu et al. |
| 2016/0130500 A1 | 5/2016 | Chen et al. |
| 2016/0185595 A1 | 6/2016 | Chen et al. |
| 2016/0200975 A1 | 7/2016 | Cooper et al. |

FOREIGN PATENT DOCUMENTS

| | | |
|---|---|---|
| JP | 2012021151 A | 2/2012 |
| JP | 2012062572 A | 3/2012 |
| JP | 2012186470 A | 9/2012 |
| JP | 2012251026 A | 12/2012 |
| WO | 2006110645 A2 | 10/2006 |
| WO | 2006127885 A1 | 11/2006 |
| WO | 2007027522 A2 | 3/2007 |
| WO | 2008036823 A2 | 3/2008 |
| WO | 2008/141206 A2 | 11/2008 |
| WO | 2008157345 A2 | 12/2008 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012154498 A2 | 11/2012 |
| WO | 2012174518 A2 | 12/2012 |
| WO | 2013058770 A1 | 4/2013 |
| WO | 2013138278 A1 | 9/2013 |
| WO | 2013170130 A1 | 11/2013 |
| WO | 2015095175 A1 | 6/2015 |
| WO | 2015130607 A1 | 9/2015 |

OTHER PUBLICATIONS

Cooke, Mike; "InAs nickelide meets 12nm ITRS requirements," Semiconductor Today, Compounds & AdvancedSilicon, 2012, pp. 1-2, vol. 7.

* cited by examiner

NI:NIGE:GE SELECTIVE ETCH FORMULATIONS AND METHOD OF USING SAME

CROSS-REFERENCE TO RELATED APPLICATIONS

This application is filed under the provisions of 35 U.S.C. § 371 and claims the priority of International Patent Application No. PCT/US2014/070566 filed on 16 Dec. 2014 entitled "NI:NIGE:GE SELECTIVE ETCH FORULATIONS AND METHOD OF USING SAME" in the name of Steven BILODEAU, et al., which claims priority to U.S. Provisional Patent Application No. 61/916,543 filed on 16 Dec. 2013, both of which are hereby incorporated by reference herein in their entirety.

FIELD

The present invention generally relates to a composition and process for the selective removal of metal relative to metal germanide, metal-III-V materials, and germanium layers. More specifically, the present invention relates to a composition and process for the selective removal of nickel relative to nickel germanide, Ni-III-V materials (i.e., nickelides) and Ge. The compositions are formulated to be substantially compatible with other materials present on the microelectronic device (e.g., low-k dielectics, silicon nitride, etc.) and result in less pitting of the metal germanide and metal-III-V layers as well as less galvanic corrosion of the germanium.

DESCRIPTION OF THE RELATED ART

An approach for modifying the electronic properties of a semiconductor element (e.g., to reduce the resistivity of a semiconductor region in a substrate, so as to change the work-function of a semiconductor gate electrode formed upon this substrate) is to deposit a metal over at least the particular semiconductor element. The stack that includes the metal and the semiconductor material is then heated to produce a semiconductor-metal compound layer. This layer has a lower resistivity than the resistivity of the starting semiconductor material and, thus, has a different work-function. Unreacted metal is then removed from the substrate, such as selectively from the semiconductor-metal compound. Such a process leaves the semiconductor-metal compound layer intact and removes excess unreacted metal from the deposition and heating operations. The semiconductor layers formed by such processes may be referred to as semiconductor metalide layers.

A semiconductor metalide layer that is obtained by selectively removing unreacted metal without performing any subsequent masking step to pattern the metalide layer is typically referred to as a self-aligned structure. In certain embodiments, an additional heating step is performed to further reduce the resistivity of the semiconductor metalide layer, e.g., by changing the crystal phase of this layer.

Examples of such semiconductor-metal compounds are silicides and Ni-III-V materials (ie., nickelides). Metal silicide thin films are commonly used in microelectronic circuits in a variety of applications, such as interconnects, contacts and for the formation of transistor gates. For example, titanium disilicide ($TiSi_2$), cobalt disilicide ($CoSi_2$), and/or nickel silicide (NiSi) are used in Ultra Large Scale Integration Semiconductor devices having submicron feature sizes. As is known, silicide layers have a lower sheet resistance than the corresponding sheet resistance of the silicon from which they are formed. Recently, nickelides such as NiInAs and NiInGaAs have been developed and show great promise as a source/drain materials for MOSFET devices.

Due to its electronic properties, germanium is, for various MOS technologies, considered to be a replacement for silicon as the semiconductor material of choice to form substrates and/or gate electrodes. Germanides, e.g., compounds resulting from the reaction between germanium and a metal, such as Ni, are used to reduce the resistivity of source and drain regions, or to reduce the resistivity of gate electrodes and, thus, modify the work-function of the gate electrodes.

In practice, a metal layer (e.g., a nickel layer) will react with germanium regions of a semiconductor structure to form a nickel germanide film, or layer. This nickel germanide layer, in turn, may be located between germanium substances of the structure and source and drain metal contacts for purposes of reducing contact resistances between the germanium substances and these contacts. After the metal layer to form the germanide layer is deposited, the resulting metal germanide and silicide regions are annealed. Subsequently the structure is selectively wet etched with an etching fluid to remove the excess or unreacted metal regions (unreacted or excess nickel regions, for example) relative to the germanide layer and the unreacted germanium. Nickelides are formed similarly when a metal layer reacts with III-V isolator layers (e.g., InAs, GaAs, etc.).

Nickelides and germanium-based substances, such as germanide films, germanium-doped regions and elemental germanium substrates, may be highly susceptible to the etchant, or etching fluid, that is conventionally used to etch nickel. For example, a typical etching fluid for nickel contains an acid, such as sulfuric acid, and an oxidant, such as hydrogen peroxide or nitric acid, which are highly oxidizing in nature. Alternatively, the etching fluids contain hydrochloric acid. Although these etching fluids may be used in a standard silicon-based process, these etching fluids undesirably pit the metal germanide and nickelide films and cause galvanic corrosion of germanium (Ge) when Ge is exposed and coupled with nickel germanide (NiGe) or NiPtGe.

Accordingly, it is an object of the present invention to provide a composition that selectively removes unreacted metal (e.g., Ni), while not substantially removing other layers (e.g., nickelides, metal germanide such as NiGe and germanium) that may be present on the surface of the microelectronic device.

SUMMARY

The present invention generally relates to a composition and process for the selective removal of metal relative to metal germanide, metal III-V layers, and germanium layers. More specifically, the present invention relates to a composition and process for the selective removal of nickel relative to nickel germanide, Ni-III-V layers, and Ge. The compositions are formulated to be substantially compatible with other materials present on the microelectronic device and result in less pitting of the metal germanide and metal III-V layers as well as less galvanic corrosion of the germanium.

In one aspect, a composition comprising at least one non-oxidizing acid, at least one unreacted metal dissolution agent, at least one germanium passivation agent, and at least one solvent is described.

In another aspect, a method of selectively removing unreacted metal material relative to metal germanide and germanium from microelectronic devices having same thereon is described, said method comprising contacting the microelectronic device with a composition at conditions useful for the selective removal of unreacted metal material relative to metal germanide and germanium, wherein the composition comprises at least one non-oxidizing acid, at least one unreacted metal dissolution agent, at least one germanium passivation agent, and at least one solvent.

In still another aspect, a method of selectively removing unreacted metal material relative to metal-III-V materials from microelectronic devices having same thereon is described, said method comprising contacting the microelectronic device with a composition at conditions useful for the selective removal of unreacted metal material relative to metal-III-V materials, wherein the composition comprises a salt of dihydrogen phosphate.

Other aspects, features and advantages will be more fully apparent from the ensuing disclosure and appended claims.

DETAILED DESCRIPTION, AND PREFERRED EMBODIMENTS THEREOF

The present invention generally relates to a composition and process for the selective removal of metal relative to metal germanide, metal-III-V layers, and germanium layers. More specifically, the present invention relates to a composition and process for the selective removal of nickel relative to nickel germanide, nickel-III-V layers (i.e., nickelides), and Ge. The compositions are formulated to be substantially compatible with other materials present on the microelectronic device (e.g., low-k dielectics, silicon nitride, etc.) and result in less pitting of the metal germanide and metal-III-V layers as well as less galvanic corrosion of the germanium.

Compositions that substantially and selectively remove unreacted metal or metals from germanium layers, germanide layers, nickelide layers, and/or dielectric layers without substantially adversely affecting those layers are disclosed. The term "selective removal of unreacted metal" or "selective etching of unreacted metal", and the like, refer to the substantial removal of such unreacted metal from germanium layers, germanide layers, nickelide layers, and/or dielectric layers without substantially affecting (etching) germanium layers, germanide layers, nickelide layers, and/or dielectric layers. The term "substantial" or "substantially", in reference to the removal (etching) of unreacted metal(s), means that more than 95% of the unreacted metal layer is removed, more than 98% of the unreacted metal layer is removed, or 99% or more of the unreacted metal is removed.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device material" are not meant to be limiting in any way and include any substrate or structure that will eventually become a microelectronic device or microelectronic assembly.

As defined herein, the "germanium" or "germanium regions" may be a bulk germanium wafer, a germanium-on-insulator (GOI) wafer in which case the layer is a germanium layer formed on a dielectric layer on top of the substrate, or may also be formed by selectively depositing germanium on a substrate. The germanium can be a continuous layer that at least partially extends over the substrate or can be divided into separate regions. These regions can be insulated from other regions by field regions, wherein the field regions can be formed by etching grooves into the substrate and filling the grooves with a dielectric material, such as an oxide. This insulation method is also known as shallow-trench-insulation (STI).

As defined herein, "nickelides" are metallic phases formed by reaction of nickel with InAs and/or GaAs such as NiGaAs, NiTnAs, and NiInGaAs.

As defined herein, a "non-oxidizing acid" corresponds to an acid that has a standard oxidation/reduction potential of less than about +0.25 V versus the standard hydrogen electrode. Examples of non-oxidizing acids include sulfuric acid, phosphoric and phosphonic acids, and most organic (e.g., carboxylic) acids, but not nitric or any "halate" acids (i.e., halogen+oxygen such as iodate, perchlorate, hypochlorite etc.).

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

"Substantially devoid" is defined herein as less than 2 wt. %, preferably less than 1 wt. %, more preferably less than 0 5 wt. %, even more preferably less than 0.1 wt. %, and most preferably 0 wt %.

As used herein, "about" is intended to correspond to ±5% of the stated value.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, a composition for selectively etching unreacted metal relative to metal germanide is described, wherein the composition does not substantially etch the metal germanide layer, low-k dielectric layer, silicon nitride layer, or STI material, and the galvanic corrosion of the germanium layers is substantially minimized or eliminated. More specifically, the composition selectively etches unreacted nickel relative to nickel germanide, wherein the composition does not substantially etch the nickel germanide layer, low-k dielectric layers, or silicon nitride layers, and the galvanic corrosion of the germanium layers is substantially minimized or eliminated. In one embodiment, said composition comprises, consists of, or consists essentially of at least one non-oxidizing acid, at least one unreacted metal dissolution agent, and at least one solvent. In another embodiment, said composition comprises, consists of, or consists essentially of at least one non-oxidizing acid, at least one unreacted metal dissolution agent, at least one Ge passivation agent, and at least one solvent. In still another embodiment, said composition comprises, consists of, or consists essentially of at least one non-oxidizing acid, at least one unreacted metal dissolution agent, at least one Ge passivation agent, at least one metal germanide passivation agent, and at least one solvent. In another embodiment, said composition comprises, consists of, or consists essentially of at least one non-oxidizing acid, at least one nickel dissolution agent, and at least one solvent. In another embodiment, said composition comprises, consists of, or consists essentially of at least one non-oxidizing acid, at least one nickel dissolution agent, at least one Ge passivation agent, and at least one solvent. In still another embodiment, said composition comprises, consists of, or consists essentially of at least one non-oxidizing acid, at least one nickel dissolution agent, at least one Ge passivation agent, at least one nickel germanide passivation agent, and at least one solvent.

The non-oxidizing acids are present to principally dissolve the nickel. Non-oxidizing acids contemplated herein include, but are not limited to, methanesulfonic acid, oxalic acid, citric acid, tartaric acid, picolinic acid, succinic acid, acetic acid, lactic acid, sulfosuccinic acid, benzoic acid, propionic acid, formic acid, oxalic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, hydrochloric acid, and combinations thereof. Preferably, the non-oxidizing acids comprise oxalic acid, 5-sulfosalicylic acid, or combinations thereof.

The unreacted metal dissolution agent, e.g., the nickel dissolution agent, aids in the dissolution of the unreacted metal. Although not wishing to be bound by theory, it is thought that this agent also scavenges oxygen. Unreacted metal dissolution agents include, but are not limited to, ammonium sulfite monohydrate, ammonium sulfate, ammonium hypophosphite, ascorbic acid, L(+)-ascorbic acid, isoascorbic acid, ascorbic acid derivatives, tetrabutyl ammonium cyanate, sodium sulfite, potassium sulfite, sodium erythorbate, tocopherol, naringenin, glutathione, and combinations thereof. Preferably, the unreacted metal dissolution agent, e.g., the nickel dissolution agent, comprises ammonium sulfite monohydrate. Most preferably, at least 50% of the ammonium sulfite monohydrate has been oxidized for the highest nickel etch rates.

Solvents contemplated include, but are not limited to, water, alcohols, glycols, glycol ethers, carbonates, and combinations thereof, such as straight-chained or branched methanol, ethanol, isopropanol, butanol, pentanol, hexanol, 2-ethyl-1-hexanol, heptanol, octanol, and higher alcohols (including diols, triols, etc.), 4-methyl-2-pentanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof. Preferably, the at least one solvent comprises water. The amount of solvent in the composition is preferably in a range from about 10 wt % to about 99.9 wt. %, more preferably in a range from about 50 wt. % to about 99.9 wt. %, and most preferably in a range from about 90 wt. % to about 99.9 wt. %.

Germanium passivation agents include, but are not limited to, boric acid, ammonium biborate, borate salts (e.g., ammonium pentaborate, sodium tetraborate, and ammonium biborate) 3-hydroxy-2-naphthoic acid, malonic acid, iminodiacetic acid, ammonium cations such as alkyltrimethlyammonium chloride or bromide and decyltrimethlyammonium chloride, carnitine, betaine and combinations thereof. Preferably, the Ge passivation agent comprises ammonium biborate.

Metal germanide passivation agents, e.g., nickel germanide passivation agents, include, but are not limited to, 2-hydroxycarboxylic acids (e.g., 2-isopropylmalic acid, 2-propylmalic acid, 3-(4-hydroxyphenyl)lactic acid, 3-propylmalic acid, 4 hydroxymandelic acid, 2-hydroxyoctanoic acid, tartaric acid, citric acid, malic acid, mandelic acid, glycolic acid, lactic acid, squaric acid), 2-oxo-carboxylic acids, salicylic acid, 5-sulfosalicylic acid, ethyl thioglycolate, 1,2-ethanedithiol, cysteine, methionine, dibenzothiophene, S-adenosylmethionine, taurine, glutathione, thiolactic acid, thiosalicylic acid, 2,2'-thiodiacetic acid, 3,3'-thiodipropionic acid, thioglycolic acid, dithiodiglycolic acid, 2,2'-(ethylenedithio)diacetic acid, 3-methoxybutyl thioglycolate, methyl thioglycolate, and combinations thereof. It is noted that the non-oxidizing acids and metal germanide passivation agents may be the same species depending on the non-oxidizing acid selected. Preferably, the metal germanide passivation agents, e.g., nickel germanide passivation agents, comprises mandelic acid.

The compositions of the first aspect have pH in a range from about 0 to about 5, preferably about 1 to about 3. Further, the compositions of the first aspect are preferably substantially devoid of chemical mechanical polishing abrasive, hydrogen peroxide, nitric acid, sulfuric acid, sulfonic acid and derivatives thereof, and combinations thereof. The selectively of removal of unreacted metal (e.g., nickel): metal germanide (e.g., NiGe) is preferably greater than 1:1, preferably greater than 3:1, more preferably greater than 5:1, and most preferably greater than 10:1. Similarly, the selectively of removal of unreacted metal (e.g., nickel):germanium is preferably greater than 1:1, preferably greater than 3:1, more preferably greater than 5:1, and most preferably greater than 10:1.

In another embodiment, the compositions of the first aspect further include dissolved nickel ions, wherein the unreacted nickel is solubilized by the composition to yield said nickel ions. For example, the composition of the first aspect may include at least one non-oxidizing acid, at least one unreacted metal dissolution agent (i.e., nickel dissolution agent), at least one Ge passivation agent, at least one solvent, and nickel ions. In another embodiment, the composition of the first aspect may include at least one non-oxidizing acid, at least one unreacted metal dissolution agent (i.e., nickel dissolution agent), at least one Ge passivation agent, at least one metal germanide passivation agent (i.e., NiGe passivation agent), at least one solvent, and nickel ions.

In an embodiment of the composition of the first aspect, the composition comprises, consists of, or consists essentially of at least one non-oxidizing acid, at least one unreacted metal dissolution agent (i.e., nickel dissolution agent), at least one Ge passivation agent, and at least one solvent, present in the following ranges, based on the total weight of the composition:

| Component | % by weight | more preferred % by weight | most preferred % by weight |
|---|---|---|---|
| non-oxidizing acid(s) | about 0.01 wt % to about 20 wt % | about 1 wt % to about 15 wt % | about 4 wt % to about 10 wt % |
| unreacted metal dissolution agent (s) | about 0.01 wt % to about 10 wt % | about 0.1 wt % to about 5 wt % | about 1 wt % to about 5 wt % |
| Ge passivation agent(s) | about 0.01 wt % to about 10 wt % | about 0.1 wt % to about 5 wt % | about 1 wt % to about 5 wt % |
| solvent(s) | about 60 to about 99.97 wt % | about 75 to about 98.8 wt % | about 80 to about 94 wt % |

Most preferably, the compositions of this embodiment comprise, consist of, or consist essentially of at least one of 5-sulfosalicylic acid, ammonium biborate, ammonium sulfite monohydrate, and water.

In another embodiment of the composition of the first aspect, the composition comprises, consists of, or consists essentially of at least one non-oxidizing acid, at least one unreacted metal dissolution agent (i.e., nickel dissolution agent), at least one Ge passivation agent, at least one metal germanide passivation agent (i.e., NiGe passivation agent), and at least one solvent, present in the following ranges, based on the total weight of the composition:

| Component | % by weight | more preferred % by weight | most preferred % by weight |
|---|---|---|---|
| non-oxidizing acid(s) | about 0.01 wt % to about 10 wt % | about 0.1 wt % to about 5 wt % | about 1 wt % to about 4 wt % |
| unreacted metal dissolution agent (s) | about 0.01 wt % to about 10 wt % | about 0.1 wt % to about 5 wt % | about 1 wt % to about 5 wt % |
| Ge passivation agent(s) | about 0.01 wt % to about 5 wt % | about 0.1 wt % to about 3 wt % | about 0.1 wt % to about 2 wt % |
| metal germanide passivation agent(s) | about 0.01 wt % to about 5 wt % | about 0.1 wt % to about 3 wt % | about 0.1 wt % to about 1 wt % |
| solvent(s) | about 70 to about 99.96 wt % | about 84 to about 99.6 wt % | about 88 to about 97.8 wt % |

Most preferably, the compositions of this embodiment comprise, consist of, or consist essentially of at least one of oxalic acid, ammonium biborate, ammonium sulfite monohydrate, mandelic acid, and water.

The compositions of the first aspect described herein is easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the compositions described herein. In one embodiment, the kit may include, in one or more containers, at least one non-oxidizing acid, at least one unreacted metal dissolution agent (i.e., nickel dissolution agent), at least one Ge passivation agent, and at least one solvent, for combining with additional solvent at the fab or the point of use. In another embodiment, the kit may include, in one or more containers, at least one non-oxidizing acid, at least one unreacted metal dissolution agent (i.e., nickel dissolution agent), at least one Ge passivation agent, at least one metal germanide passivation agent (i.e., NiGe passivation agent), and at least one solvent, for combining with at least one solvent at the fab or the point of use. The containers of the kit must be suitable for storing and shipping said compositions, for example, NOWPak® containers (Advanced Technology Materials, Inc., Danbury, Conn., USA).

The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended cleaning composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008 in the name of Advanced Technology Materials, Inc.

In a third aspect, a composition for selectively etching unreacted metal relative to metal-III-V layers is described, wherein the composition does not substantially etch the metal-III-V layers. More specifically, the composition selectively etches unreacted nickel relative to nickel III-V layers (i.e., nickelides). In one embodiment, said composition comprises, consists of, or consists essentially of a salt of a dihydrogen phosphate ($H_2PO_4^{-1}$). In another embodiment, said composition comprises, consists of, or consists essentially of a salt of a hydrogen phosphate ($HPO_4^{2-}$). Possible salts include, but are not limited to, ammonium, lithium, sodium, potassium, rubidium, cesium, magnesium, calcium, tetraalkylammonium cations having the formula $(NR_1R_2R_3R_4)^+$, wherein $R_1$, $R_2$, $R_3$, and $R_4$ can be the same as or different from one another and are selected from the group consisting of hydrogen and branched or unbranched $C_1$-$C_6$ alkyls. Preferably, the salt is ammonium.

The compositions of the third aspect have pH in a range from about 1 to about 7, preferably about 3 to about 7. Further, the compositions of the third aspect are preferably substantially devoid of chemical mechanical polishing abrasive, hydrogen peroxide, nitric acid, sulfuric acid, hydrochloric acid, sulfonic acid and derivatives thereof, and combinations thereof. The selectively of removal of unreacted metal (e.g., nickel):metal-III-V materials (e.g., nickelides) is preferably greater than 1:1, preferably greater than 3:1, more preferably greater than 5:1, and most preferably greater than 10:1.

In another embodiment, the compositions of the third aspect further include dissolved nickel ions, wherein the unreacted nickel is solubilized by the composition to yield said nickel ions. For example, the composition of the third aspect may include a salt of dihydrogen phosphate and nickel ions.

In use of the compositions of the first aspect for selectively removing unreacted metal material (e.g., unreacted nickel) relative to metal germanide (e.g., NiGe) and germanium from microelectronic devices having same thereon, the compositions typically are contacted with the device for a time of from about 10 sec to about 180 minutes, preferably about 1 minute to about 5 minutes, at temperature in a range of from about 15° C. to about 100° C., preferably about 20° C. to about 70° C. Such contacting times and temperatures are illustrative, and any other suitable time and temperature conditions may be employed that are efficacious to at least partially remove the unreacted metal (e.g., unreacted nickel) from the device. "At least partially remove" corresponds to the removal of at least 85% of the unreacted metal (e.g., unreacted nickel), more preferably at least 90%, even more preferably at least 95%, and most preferred at least 99%. Advantageously, the compositions of the first aspect selectively remove unreacted metal (e.g., unreacted nickel) relative to metal germanide (e.g., NiGe) and germanium without substantially removing other materials present on the microelectronic device such as low-k dielectric materials, shallow trench isolation materials, and silicon nitride.

In use of the compositions of the third aspect for selectively removing unreacted metal material (e.g., unreacted nickel) relative to metal-III-V layers (e.g., Ni-III-V layers) from microelectronic devices having same thereon, the compositions typically are contacted with the device for a time of from about 10 sec to about 180 minutes, preferably about 1 minute to about 5 minutes, at temperature in a range of from about 15° C. to about 100° C., preferably about 20° C. to about 70° C. Such contacting times and temperatures are illustrative, and any other suitable time and temperature conditions may be employed that are efficacious to at least partially remove the unreacted metal (e.g., unreacted nickel) from the device. "At least partially remove" corresponds to the removal of at least 85% of the unreacted metal (e.g., unreacted nickel), more preferably at least 90%, even more preferably at least 95%, and most preferred at least 99%. Advantageously, the compositions of the third aspect selectively remove unreacted metal (e.g., unreacted nickel) relative to metal-III-V layers (e.g., Ni-III-V layers) without substantially removing other materials present on the microelectronic device such as low-k dielectric materials, shallow trench isolation materials, and silicon nitride.

Following the achievement of the desired removal action, the respective compositions may be readily removed from the device to which they have been previously applied, as may be desired and efficacious in a given end use application of the compositions described herein. Preferably, the rinse solution for the composition includes deionized water. Thereafter, the device may be dried using nitrogen or a spin-dry cycle.

Yet another aspect relates to the improved microelectronic devices made according to the methods described herein and to products containing such microelectronic devices. Preferably, the microelectronic device comprises the germanide NiGe. Alternatively, the microelectronic device comprises a nickelide as defined herein.

A still further aspect relates to methods of manufacturing an article comprising a microelectronic device, said method comprising contacting the microelectronic device with a composition for sufficient time to selectively remove unreacted metal material (e.g., unreacted nickel) relative to metal germanide (e.g., NiGe) and germanium from the microelectronic device, and incorporating said microelectronic device into said article, using a composition described herein. Preferably, the microelectronic device comprises comprises the germanide NiGe.

Another aspect relates to an article of manufacture comprising a composition, a microelectronic device wafer, and material selected from the group consisting of NiGe, Ni, and Ge, wherein the composition comprises at least one non-oxidizing acid, at least one unreacted metal dissolution agent (i.e., nickel dissolution agent), at least one Ge passivation agent, and at least one solvent. Alternatively, the composition comprises at least one non-oxidizing acid, at least one unreacted metal dissolution agent (i.e., nickel dissolution agent), at least one Ge passivation agent, at least one metal germanide passivation agent (i.e., NiGe passivation agent), and at least one solvent.

A still further aspect relates to methods of manufacturing an article comprising a microelectronic device, said method comprising contacting the microelectronic device with a composition for sufficient time to selectively remove unreacted metal material (e.g., unreacted nickel) relative to metal-III-V material (e.g., Ni-III-V materials) from the microelectronic device, and incorporating said microelectronic device into said article, using a composition described herein. Preferably, the microelectronic device comprises comprises a nickelide as defined herein.

The features and advantages are more fully shown by the illustrative examples discussed below.

EXAMPLE 1

Formulations were prepared and were tested using electrochemical methods to determine galvanic Ge corrosion and Ni:NiGe selectivity. The formulations are as follows:

Formulation A: 2 wt % oxalic acid (98%), 2 wt % ammonium sulfite monohydrate, 0.40 wt % ammonium biborate tetrahydrate (ABB), 0.20 wt % DL-mandelic acid, 95.40 wt % water Formulation B: 2 wt % oxalic acid (98%), 2 wt % ammonium sulfite monohydrate, 1 wt % ammonium biborate tetrahydrate (ABB), 0.40 wt % DL-mandelic acid, 94.60 wt % water Formulation C: 4 wt % 5-sulfosalicylic acid, 1 wt % ammonium biborate tetrahydrate (ABB), 2 wt % ammonium sulfite monohydrate, 93 wt % water Formulation D: 6 wt % 5-sulfosalicylic acid, 1 wt % ammonium biborate tetrahydrate (ABB), 4 wt % ammonium sulfite monohydrate, 89 wt % water Formulation E: 8 wt % 5-sulfosalicylic acid, 1 wt % ammonium biborate tetrahydrate (ABB), 4 wt % ammonium sulfite monohydrate, 87 wt % water A 0.1 N HCl control solution was also prepared.

The results of the experiments are shown in Table 1 below.

TABLE 1

Electrochemical experiments

| Formulation | NiGe corrosion rate (A/min) | Ni corrosion rate (A/min) | Ni:NiGe selectivity | Ge corrosion rate (A/min) | Ge:NiGe galvanic corrosion rate | Ge:Ni galvanic corrosion rate |
|---|---|---|---|---|---|---|
| Control | 0.733 | 2.685 | 3.663 | 0.011 | 0.342 | 0.013 |
| A | 1.941 | 16.611 | 8.558 | N/A | N/A | N/A |
| B | 1.689 | 27.108 | 16.05 | 0.016 | 0.046 | none |
| C | 3.434 | 17.83 | 5.192 | 0.047 | 0.199 | none |
| D | 0.655 | 21.466 | 32.773 | N/A | N/A | N/A |
| E | 2.404 | 30.016 | 12.486 | N/A | N/A | N/A |
| F | 82.84 | 78.95 | 0.95 | 0.19 | 1.09 | 0.682 | higher etch rates after aging. The present inventors confirmed by Raman spectra that this was due to oxidation of some of the ammonium sulfite to generate ammonium sulfate. Nickel etch rates for formulations that included 92 wt % water, 3 wt % methanesulfonic acid, 1 wt % ammonium biborate tetrahydrate with various mixtures of ammonium sulfite monohydrate and ammonium sulfate totaling to 4 wt %. It was determined that a threshold of around half of the ammonium sulfite needs to be present in the oxidized form (i.e., ammonium sulfate) to achieve high Ni etch rates. Galvanic corrosion studies determined that with as much as 90% of the ammonium sulfite monohydrate in the reduced form, Ge is galvanically protected in the presence of NiGe. This is important since during device manufacture there may be small regions of exposed Ge during the nickel removal. Accordingly, preferably, the compositions herein have a window of between 10 and 50 wt % of the ammonium sulfite monohydrate present in the reduced form.

A composition comprising 2 wt % ammonium sulfite monohydrate, 2 wt % ammonium sulfate, 3 wt % methanesulfonic acid, 1 wt % ammonium biborate tetrahydrate, and 92 wt % water (hereinafter Formulation F) was prepared and the corrosion rates of NiGe, Ni, and Ge was determined following immersion in the composition at 25° C. temperature for 2 minutes. The experimental results are reported in Table 1 above.

TABLE 2

Ni etch rates and NiInAs Loss Percentage

| | | | | Solutions | | | | | | | | NiInAs loss % | |
|---|---|---|---|---|---|---|---|---|---|---|---|---|---|
| MSA | ammonium oxalate | ammonium sulfate | ammonium trifluoro-acetate | ammonium dihydrogen phosphate | ammonium acetate | ammonium sulfite | $H_3PO_4$ | $NH_4Cl$ | ABB | pH | Ni ER (Å/min) | Ni intensity | In intensity |
| | 2 | | | | | | | | | 6.55 | 6.8 | 91.73 | 0.31 |
| | | 2 | | | | | | | | 5.43 | -3.7 | 2.24 | 2.08 |
| | | | 2.2 | | | | | | | 5.26 | 1.4 | -2.90 | -4.78 |
| | | | | 2 | | | | | | 4.5 | 202.7 | 0.1 | -1.99 |
| 0.1 | | | | 2 | | | | | | 3.23 | 216.1 | 35.30 | -2.63 |
| 0.1 | | | | 2 | | | | | 1 | 6.36 | 10.1 | 4.27 | 0.03 |
| | | | | | 1.3 | | | | | 6.76 | 0.8 | -0.48 | -0.08 |
| | | | | | | 2 | | | | 8.11 | 3.5 | -0.56 | -0.60 |
| | | | | | | | 2.5 | | | 1.38 | 215.3 | 93.07 | 9.98 |
| | | | | | | | | 1 | | 5.1 | 0.5 | 9.57 | 0.08 |

It can be seen that the selectivity of Ni:NiGe is much improved using the formulations described herein relative to a prior art formulation (i.e., HCl).

EXAMPLE 2

Several solutions comprising at least one of methanesulfonic acid (MSA), ammonium oxalate, ammonium sulfate, ammonium trifluoroacetate, ammonium dihydrogen phosphate, ammonium acetate, ammonium sulfite, phosphoric acid, and ammonium chloride were prepared as reported in Table 2, wherein the amounts are reported percent by weight and the balance is water. The nickel etch rate and the NiInAs loss percentage measured at 45° C. after two minutes of immersion in each respective solution. The results are reported in Table 2.

It can be seen that the ammonium dihydrogen phosphate solution had a Ni etch rate greater than 200 Å min$^{-1}$ as well as a low loss percentage of NiInAs material.

EXAMPLE 3

During formulation testing it was determined that a formulation had low etch rates when initially mixed but showed Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition comprising about 0.01 wt % to about 10 wt % of at least one non-oxidizing acid, about 0.01 wt % to about 10 wt % of at least one unreacted metal dissolution agent, about 0.01 wt % to about 5 wt % of at least one germanium passivation agent, about 0.01 wt % to about 5 wt % of at least one metal germanide passivation agent, and about 70 wt % to about 99.96 wt % of at least one solvent,
   wherein the at least one non-oxidizing acid comprises a species selected from the group consisting of methanesulfonic acid, oxalic acid, citric acid, tartaric acid, picolinic acid, succinic acid, lactic acid, sulfosuccinic acid, benzoic acid, propionic acid, formic acid, oxalic acid, maleic acid, malonic acid, fumaric acid, malic acid, ascorbic acid, mandelic acid, heptanoic acid, butyric acid, valeric acid, glutaric acid, phthalic acid, hypophosphorous acid, 5-sulfosalicylic acid, hydrochloric acid, and combinations thereof, preferably oxalic acid, 5 sulfosalicylic acid, or combinations thereof;
   wherein the unreacted metal dissolution agent comprises a species selected from the group consisting of ammonium sulfite monohydrate, ammonium sulfate, ammonium hypophosphite, tetrabutyl ammonium cyanate, sodium sulfite, potassium sulfite, sodium erythorbate, tocopherol, naringenin, glutathione, and combinations thereof;
   wherein the germanium passivation agent comprises a species selected from the group consisting of boric acid, ammonium biborate, ammonium pentaborate, sodium tetraborate, 3-hydroxy-2-naphthoic acid, malonic acid, alkyltrimethylammonium chloride, alkyltrimethylammonium bromide, decyltrimethylammonium chloride, carnitine, betaine, and combinations thereof;
   wherein the metal germanide passivation agent comprises a species selected from the group consisting of 2-isopropylmalic acid, 2-propylmalic acid, 3-(4-hydroxyphenyl)lactic acid, 3-propylmalic acid, 4 hydroxymandelic acid, 2-hydroxyoctanoic acid, mandelic acid, squaric acid, 2-oxo-carboxylic acids, 5-sulfosalicylic acid, ethyl thioglycolate, 1,2-ethanedithiol, cysteine, methionine, dibenzothiophene, S-adenosylmethionine, taurine, glutathione, thiolactic acid, thiosalicylic acid, 2,2'-thiodiacetic acid, 3,3'-thiodipropionic acid, thioglycolic acid, dithiodiglycolic acid, 2,2'-(ethylenedithio)diacetic acid, 3-methoxybutyl thioglycolate, methyl thioglycolate, and combinations thereof and wherein the composition selectively removes unreacted metal relative to metal germanide, metal-III-V materials and germanium from the microelectronic device having the same thereon; and
   wherein the solvent comprises a species selected from the group consisting of water, methanol, ethanol, isopropanol, butanol, pentanol, hexanol, 2-ethyl-1-hexanol, heptanol, octanol, and higher alcohols, 4-methyl-2-pentanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof.

2. The composition of claim 1, wherein the at least one non-oxidizing acid comprises oxalic acid, 5-sulfosalicylic acid, or combinations thereof.

3. The composition of claim 1, wherein the unreacted metal dissolution agent comprises ammonium sulfite monohydrate.

4. The composition of claim 1, wherein the solvent comprises water.

5. The composition of claim 1, wherein the germanium passivation agent comprises ammonium biborate.

6. The composition of claim 1, wherein the pH is in a range from 0 to about 5.

7. The composition of claim 1, wherein the composition is substantially devoid of chemical mechanical polishing abrasive, hydrogen peroxide, nitric acid, sulfuric acid, sulfonic acid and derivatives thereof, and combinations thereof.

8. A method of selectively removing unreacted metal material relative to metal germanide, metal-III-V materials, and germanium from microelectronic devices having the same thereon, said method comprising contacting the microelectronic device with a composition, wherein the composition comprises at least one non-oxidizing acid, at least one unreacted metal dissolution agent, at least one germanium passivation agent, at least one metal germanide passivation agent, and at least one solvent, wherein the metal germanide passivation agent comprises a species selected from the group consisting of 2-isopropylmalic acid, 2-propylmalic acid, 3-(4-hydroxyphenyl)lactic acid, 3-propylmalic acid, 4 hydroxymandelic acid, 2-hydroxyoctanoic acid, mandelic acid, squaric acid, 2-oxo-carboxylic acids, salicylic acid, 5-sulfosalicylic acid, ethyl thioglycolate, 1,2-ethanedithiol, cysteine, methionine, dibenzothiophene, S-adenosylmethionine, taurine, glutathione, thiolactic acid, thiosalicylic acid, 2,2'-thiodiacetic acid, 3,3'-thiodipropionic acid, thioglycolic acid, dithiodiglycolic acid, 2,2'-(ethylenedithio)diacetic acid, 3-methoxybutyl thioglycolate, methyl thioglycolate, and combinations thereof, and wherein unreacted metal material is selectively removed relative to metal germanide, metal-III-V materials and germanium from the microelectronic device having the same thereon.

9. The method of claim 8, wherein the unreacted metal is nickel.

10. The method of claim 8, wherein the metal germanide is nickel germanide.

11. The method of claim 8, wherein the selectively of removal of unreacted metal:metal germanide is greater than 1:1.

12. The method of claim 8, wherein the selectively of removal of unreacted metal:germanium is greater than 1:1.

* * * * *